(12) United States Patent
Lee et al.

(10) Patent No.: US 11,527,564 B2
(45) Date of Patent: Dec. 13, 2022

(54) MANUFACTURING METHOD OF IMAGE SENSOR

(71) Applicant: Powerchip Semiconductor Manufacturing Corporation, Hsinchu (TW)

(72) Inventors: Shih-Ping Lee, Hsinchu (TW); Pin-Chieh Huang, Hsinchu County (TW); Jui-Hung Hung, Hsinchu (TW); Yi-Chen Yeh, Chiayi (TW); Cheng-Han Yang, Hsinchu (TW); Wen-Hao Huang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 173 days.

(21) Appl. No.: 17/145,413

(22) Filed: Jan. 11, 2021

(65) Prior Publication Data

US 2021/0134864 A1 May 6, 2021

Related U.S. Application Data

(62) Division of application No. 16/184,919, filed on Nov. 8, 2018, now Pat. No. 10,937,819.

(30) Foreign Application Priority Data

Aug. 29, 2018 (TW) .................................. 107130190

(51) Int. Cl.
*H01L 27/146* (2006.01)

(52) U.S. Cl.
CPC .. *H01L 27/14614* (2013.01); *H01L 27/14623* (2013.01); *H01L 27/14689* (2013.01); *H01L 27/14621* (2013.01); *H01L 27/14627* (2013.01)

(58) Field of Classification Search
CPC ......... H01L 27/14623; H01L 27/14689; H01L 27/14614; H01L 27/1462; H01L 27/14621; H01L 27/1463; H01L 27/14627
See application file for complete search history.

(56) References Cited

U.S. PATENT DOCUMENTS

| | | | |
|---|---|---|---|
| 2005/0133879 A1* | 6/2005 | Yamaguti | H01L 27/14621 257/435 |
| 2009/0224162 A1* | 9/2009 | Inuiya | G01T 1/244 250/370.09 |
| 2010/0230729 A1* | 9/2010 | Ellis-Monaghan | H01L 27/14609 716/30 |

(Continued)

*Primary Examiner* — Vongsavanh Sengdara
(74) *Attorney, Agent, or Firm* — JCIPRNET

(57) ABSTRACT

A manufacturing method of an image sensor including the following steps is provided. A substrate is provided. A light sensing device is formed in the substrate. A storage node is formed in the substrate. The storage node and the light sensing device are separated from each other. A buried gate structure is formed in the substrate. The buried gate structure includes a buried gate and a first dielectric layer. The buried gate is disposed in the substrate and covers at least a portion of the storage node. The first dielectric layer is disposed between the buried gate and the substrate. A first light shielding layer is formed on the buried gate. The first light shielding layer is located above the storage node and electrically connected to the buried gate.

8 Claims, 10 Drawing Sheets

(56) References Cited

U.S. PATENT DOCUMENTS

| | | | | |
|---|---|---|---|---|
| 2015/0123179 A1* | 5/2015 | Kikuchi | ............ | H01L 27/14609 |
| | | | | 257/292 |
| 2016/0286151 A1* | 9/2016 | Lahav | .................. | H04N 5/3765 |
| 2017/0207257 A1* | 7/2017 | Nishihara | ............ | H04N 5/3745 |
| 2017/0323912 A1* | 11/2017 | Lahav | ................ | H04N 5/37452 |
| 2020/0035724 A1* | 1/2020 | Machida | .................. | H04N 9/07 |

* cited by examiner

MANUFACTURING METHOD OF IMAGE SENSOR

CROSS-REFERENCE TO RELATED APPLICATION

This application is a divisional application of and claims the priority benefit of U.S. application Ser. No. 16/184,919, filed on Nov. 8, 2018, now allowed, which claims the priority benefit of Taiwan application serial no. 107130190, filed on Aug. 29, 2018. The entirety of each of the above-mentioned patent applications is hereby incorporated by reference herein and made a part of this specification.

BACKGROUND OF THE INVENTION

Field of the Invention

The invention relates to a semiconductor device and a manufacturing method therefore, and particularly relates to an image sensor and a manufacturing method therefore.

Description of Related Art

Currently, there are some types of image sensors (e.g., the global shutter image sensor) having a storage node for storing signals. However, stray light interferes with the signals stored in the storage node. Therefore, how to effectively prevent stray light interference is the goal of ongoing research and development.

SUMMARY OF THE INVENTION

The invention provides an image sensor and a manufacturing method therefore, which effectively prevents stray light interference.

The invention provides an image sensor including a substrate, a light sensing device, a storage node, a buried gate structure, and a first light shielding layer. The light sensing device is disposed in the substrate. The storage node is disposed in the substrate. The storage node and the light sensing device are separated from each other. The buried gate structure includes a buried gate and a first dielectric layer. The buried gate is disposed in the substrate and covers at least a portion of the storage node. The first dielectric layer is disposed between the buried gate and the substrate. The first light shielding layer is disposed on the buried gate and located above the storage node. The first light shielding layer is electrically connected to the buried gate.

According to an embodiment of the invention, in the aforementioned image sensor, a portion of the buried gate may be located in the substrate between the light sensing device and the storage node.

According to an embodiment of the invention, in the aforementioned image sensor, a material of the first light shielding layer is, for example, a metal or a metal compound.

According to an embodiment of the invention, the aforementioned image sensor may further include a second light shielding layer. The second light shielding layer is disposed on the first light shielding layer.

According to an embodiment of the invention, in the aforementioned image sensor, the first light shielding layer may have an extending portion. The extending portion extends into the buried gate.

According to an embodiment of the invention, in the aforementioned image sensor, the extending portion may be extended to the first dielectric layer.

According to an embodiment of the invention, in the aforementioned image sensor, the extending portion may be located between the light sensing device and the storage node.

According to an embodiment of the invention, the aforementioned image sensor may further include a third light shielding layer. The third light shielding layer is disposed between the first light shielding layer and the buried gate.

According to an embodiment of the invention, the aforementioned image sensor may further include a second dielectric layer. The second dielectric layer is disposed between the first light shielding layer and the buried gate. The extending portion passes through the second dielectric layer and extends into the buried gate.

According to an embodiment of the invention, the aforementioned image sensor may further include a pinning layer. The pinning layer is disposed in the substrate and located between the light sensing device and a surface of the substrate.

According to an embodiment of the invention, the aforementioned image sensor may further include a gate structure and a floating diffusion region. The gate structure includes a gate and a third dielectric layer. The gate is disposed on the substrate and located at one side of the buried gate away from the light sensing device. The gate and the buried gate are separated from each other. The third dielectric layer is disposed between the gate and the substrate. The floating diffusion region is disposed in the substrate and located at one side of the gate structure away from the buried gate structure.

According to an embodiment of the invention, the aforementioned image sensor may further include a color filter layer and a microlens. The color filter layer is disposed above the light sensing device. The microlens is disposed on the color filter layer.

The invention provides an image sensor manufacturing method including the following steps. A substrate is provided. A light sensing device is formed in the substrate. A storage node is formed in the substrate. The storage node and the light sensing device are separated from each other. A buried gate structure is formed in the substrate. The buried gate structure includes a buried gate and a first dielectric layer. The buried gate is disposed in the substrate and covers at least a portion of the storage node. The first dielectric layer is disposed between the buried gate and the substrate. A first light shielding layer is formed on the buried gate. The first light shielding layer is located above the storage node, and electrically connected to the buried gate.

According to an embodiment of the invention, the manufacturing method of the aforementioned image sensor may further include forming a second light shielding layer on the first light shielding layer.

According to an embodiment of the invention, in the manufacturing method of the aforementioned image sensor, the first light shielding layer may have an extending portion. The extending portion extends into the buried gate.

According to an embodiment of the invention, the manufacturing method of the aforementioned image sensor may further include forming a third light shielding layer between the first light shielding layer and the buried gate.

According to an embodiment of the invention, the manufacturing method of the aforementioned image sensor may further include forming a second dielectric layer between the first light shielding layer and the buried gate.

The extending portion passes through the second dielectric layer and extends into the buried gate.

According to an embodiment of the invention, the manufacturing method of the aforementioned image sensor may further include forming a pinning layer in the substrate. The pinning layer is located between the light sensing device and a surface of the substrate.

According to an embodiment of the invention, the manufacturing method of the aforementioned image sensor may further include the following steps. The gate structure is formed on the substrate. The gate structure includes a gate and a third dielectric layer. The gate is disposed on the substrate and located at one side of the buried gate away from the light sensing device. The gate and the buried gate are separated from each other. The third dielectric layer is disposed between the gate and the substrate. The floating diffusion region is formed in the substrate. The floating diffusion region is located at one side of the gate structure away from the buried gate structure.

According to an embodiment of the invention, the manufacturing method of the aforementioned image sensor may further include the following steps. The color filter layer is formed above the light sensing device. The microlens is formed on the color filter layer.

Based on the above, in the aforementioned image sensor and the manufacturing method therefore, the buried gate is disposed in the substrate and covers at least a portion of the storage node. The first light shielding layer is disposed on the buried gate and located above the storage node. Therefore, the first light shielding layer may block stray light from illuminating the storage node to effectively prevent stray light interference.

To make the above features and advantages of the disclosure more comprehensible, embodiments accompanied with drawings are described in detail as follows.

DESCRIPTION OF THE EMBODIMENTS

FIG. 1A to FIG. 1F are cross-sectional views of a manufacturing process of an image sensor according to an embodiment of the invention.

Figure 1A:
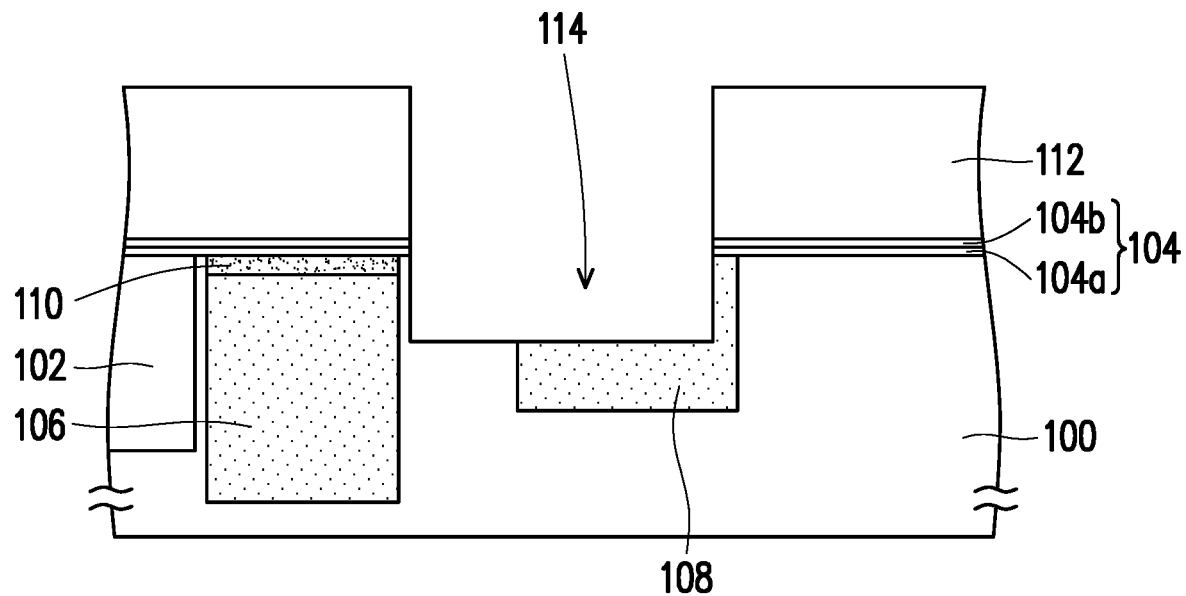
FIG. 1A to FIG. 1F are cross-sectional views of a manufacturing process of an image sensor according to an embodiment of the invention.

Please refer to FIG. 1A, a substrate 100 is provided. The substrate 100 is, for example, a silicon substrate. The substrate 100 may have an isolation structure 102. The isolation structure 102 is, for example, a shallow trench isolation (STI) structure. A material of the isolation structure 102 is, for example, silicon oxide. A mask structure 104 may be formed on the substrate 100. The mask structure 104 may be a single layer structure or a multilayer structure. In the present embodiment, the mask structure 104 is exemplified by the multilayer structure, but the invention is not limited thereto. For instance, the mask structure 104 includes a mask layer 104a and a mask layer 104b. The mask layer 104a is disposed on the substrate 100. A material of the mask layer 104a is, for example, silicon oxide. The mask layer 104b is disposed on the mask layer 104a. A material of the mask layer 104b is, for example, silicon nitride.

Besides, the substrate 100 may have a first conductive type. Hereinafter, the first conductive type and the second conductive type may be one and the other of the P-type conductive type and the N-type conductive type, respectively. In the present embodiment, the first conductive type is exemplified by the P-type conductive type, and the second conductive type is exemplified by the N-type conductive type, but the invention is not limited thereto.

A light sensing device 106 is formed in the substrate 100. The light sensing device 106 may be a photodiode. In the present embodiment, the light sensing device 106 is, for example, a doped region of the second conductive type (e.g., N-type), such as a well region of the second conductive type. A forming method of the light sensing device 106 is, for example, ion implantation.

A storage node 108 is formed in the substrate 100. The storage node 108 and the light sensing device 106 are separated from each other. The storage node 108 is, for example, a doped region of the second conductive type (e.g., N-type), such as the well region of second conductive type. A forming method of the storage node 108 is, for example, ion implantation.

A pinning layer 110 may be formed in the substrate 100. The pinning layer 110 is located between the light sensing device 106 and a surface of the substrate 100. The pinning layer 110 may be used to reduce dark current. The pinning layer 110 is, for example, a heavily doped region of the first conductive type (e.g., P-type). A forming method of the pinning layer 110 is, for example, ion implantation.

In addition, people skilled in the art may determine the forming order of the light sensing device 106, the storage node 108, and the pinning layer 110 according to process requirements.

A patterned photoresist layer 112 may be formed on the mask layer 104. A material of the patterned photoresist layer 112 is, for example, a positive photoresist material or a negative photoresist material. A forming method of the patterned photoresist layer 112 is, for example, a lithography process.

A recess 114 may be formed in the substrate 100. The recess 114 may expose the storage node 108. A forming method of the recess 114 is, for example, removing a portion of the mask layer 104 and a portion of the substrate 100 by using the patterned photoresist layer 112 as a mask. The removing method of a portion of the mask layer 104 and a portion of the substrate 100 is, for example, a dry etching method or a wet etching method.

Figure 1B:
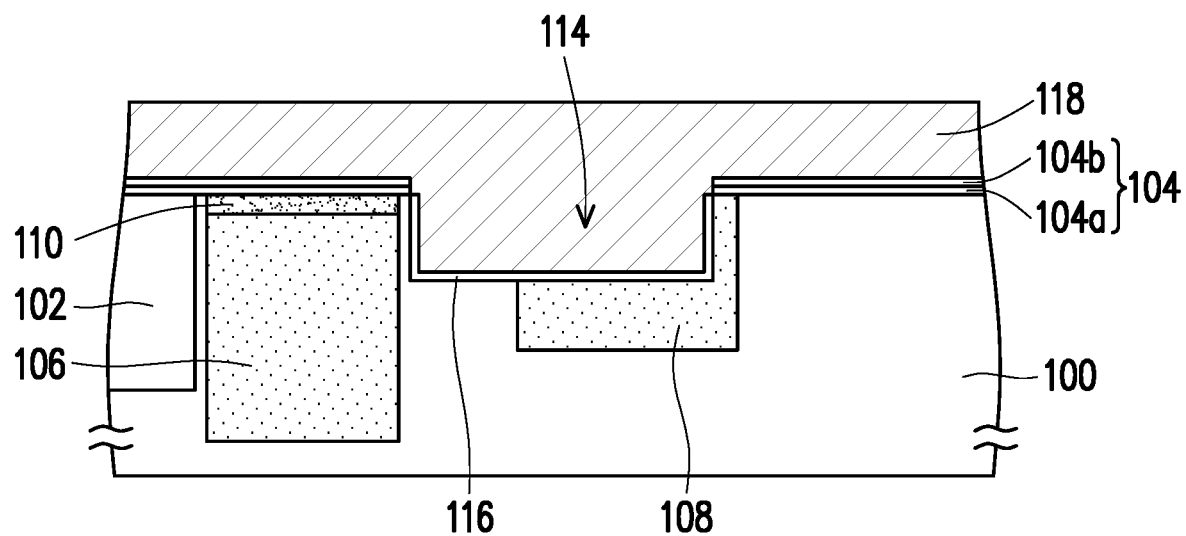

Please refer to FIG. 1B, the patterned photoresist layer 112 is removed. The removing method of the patterned photoresist layer 112 is, for example, a dry stripping method or a wet stripping method.

A dielectric layer 116 may be formed on a surface of the recess 114. A material of the dielectric layer 116 is, for example, silicon oxide, silicon nitride or a combination thereof. A forming method of the dielectric layer 116 is, for example, thermal oxidation, nitridation, or chemical vapor deposition.

A conductive layer 118 filling up the recess 114 may be formed. A material of the conductive layer 118 is, for example, doped polysilicon, but the invention is not limited thereto. A forming method of the conductive layer 118 is, for example, chemical vapor deposition. The conductive layer 118 may have the first conductive type or the second conductive type. In the present embodiment, the conductive layer 118 is exemplified by having the second conductive type (e.g., N-type).

Figure 1C:
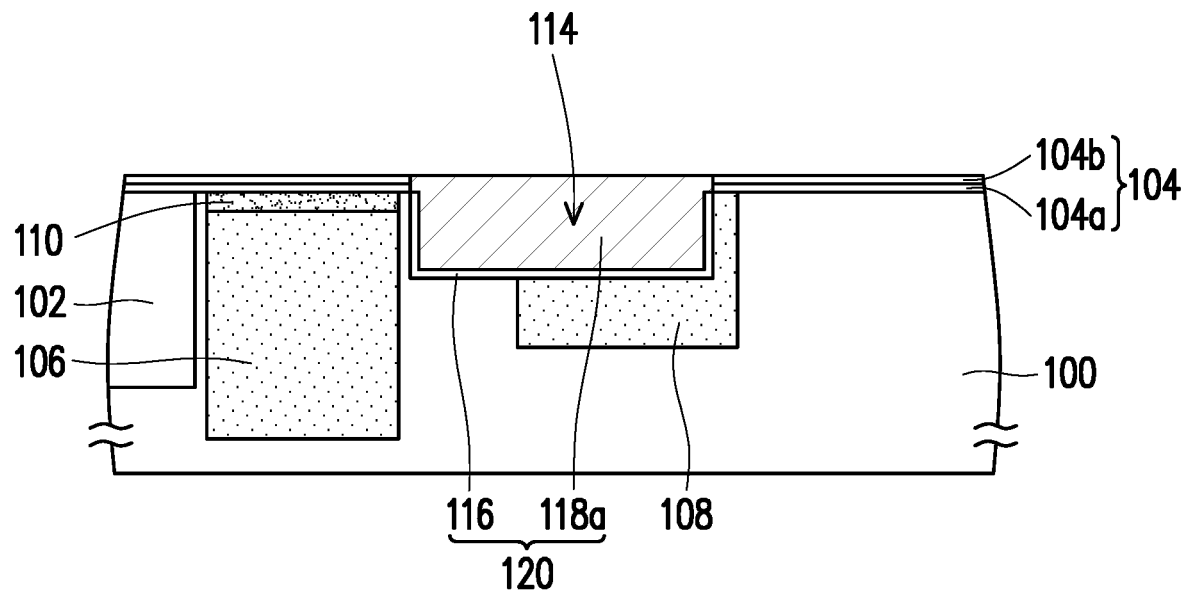

Please refer to FIG. 1C, the conductive layer 118 outside the recess 114 may be removed to form a buried gate 118a in the substrate 100. The removing method of the conductive layer 118 outside the recess 114 is that, for example, the mask layer 104 is used as a stop layer, and a chemical mechanical polishing process is performed on the conductive layer 118.

Thereby, a buried gate structure 120 may be formed in the substrate 100. The buried gate structure 120 includes the buried gate 118a and the dielectric layer 116. The buried gate 118a is disposed in the substrate 100 and covers at least a portion of the storage node 108. A portion of the storage node 108 may be located in the substrate 100 at one side of the buried gate 118a away from the light sensing device 106 and may be extended to the surface of the substrate 100. The dielectric layer 116 is disposed between the buried gate 118a and the substrate 100. In the present embodiment, although the buried gate structure 120 is formed by the aforementioned methods, the invention is not limited thereto.

Figure 1D:
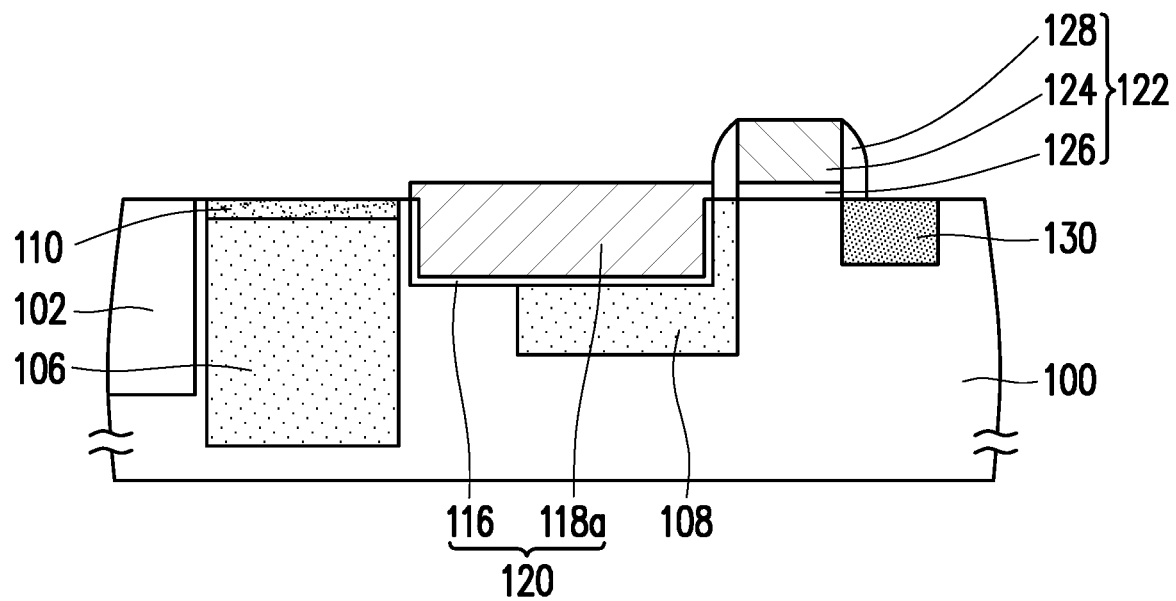

Please refer to FIG. 1D, the mask layer 104 may be removed. The removing method of the mask layer 104 is, for example, the wet etching method. An etchant used in the wet etching method is, for example, phosphoric acid or hydrofluoric acid. People skilled in the art may choose a suitable etchant according to the material of the mask layer 104.

A gate structure 122 may be formed on the substrate 100. The gate structure 122 includes a gate 124 and a dielectric layer 126. The gate structure 122 may further include a spacer 128. The gate 124 is disposed on the substrate 100 and located at one side of the buried gate 118a away from the light sensing device 106. The gate 124 and the buried gate 118a are separated from each other. The dielectric layer 126 is disposed between the gate 124 and the substrate 100. The spacer 128 is disposed on a sidewall of the gate 124. A forming method of the gate structure 122 may be carried out by a method known to people skilled in the art and are not further illustrated here.

A floating diffusion region 130 may be formed in the substrate 100. The floating diffusion region 130 is located at one side of the gate structure 122 away from the buried gate structure 120. The floating diffusion region 130 may have the second conductive type (e.g., N-type). A forming method of the floating diffusion region 130 is, for example, ion implantation.

Figure 1E:
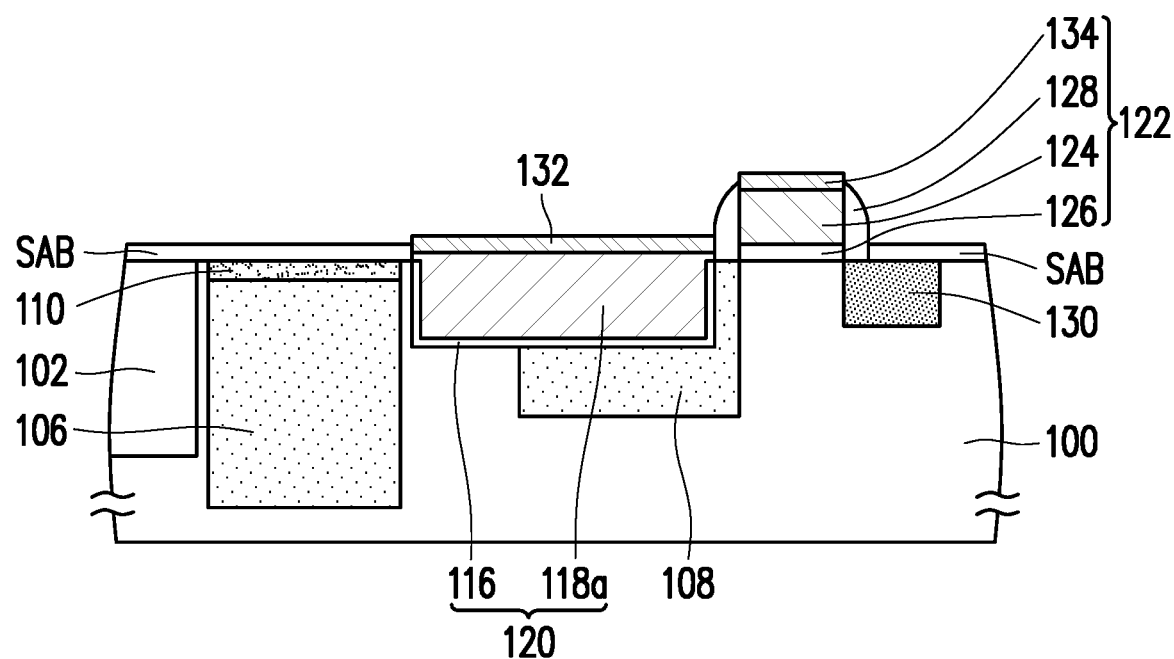

Please refer to FIG. 1E, a light shielding layer 132 is formed on the buried gate 118a. The light shielding layer 132 is located above the storage node 108 and electrically connected to the buried gate 118a. A material of the light shielding layer 132 is, for example, a metal or a metal compound (e.g., a metal silicide). In the present embodiment, the material of the light shielding layer 132 is exemplified by the metal silicide. The metal silicide is, for example, cobalt silicide or nickel silicide. A forming method of the light shielding layer 132 is, for example, performing a salicidation process. In another embodiment, the forming method of the light shielding layer 132 may also be chemical vapor deposition or physical vapor deposition.

Additionally, a metal silicide layer 134 may be formed on the gate 124. The gate structure 122 may further include the metal silicide layer 134. A material of the metal silicide layer 134 is, for example, a metal silicide such as cobalt silicide or nickel silicide. A forming method of the metal silicide layer 134 is, for example, performing the salicidation process. The metal silicide layer 134 and the light shielding layer 132 may be formed by the same or different process. Under the condition that the material of the light shielding layer 132 is the metal silicide, the metal silicide layer 134 and the light shielding layer 132 may be formed by the same process. For example, a salicide block layer SAB exposing the buried gate 118a and the gate 124 may be formed on the substrate 100, and then the light shielding layer 132 and the metal silicide layer 134 may be respectively formed on the buried gate 118a and the gate 124 by the salicidation process. In another embodiment, in the step of forming the salicide block layer SAB, the salicide block layer SAB may extend on a portion of the buried gate 118a to cover a portion of the buried gate 118a, thereby helping to prevent the subsequently formed light shielding layer 132 from bridging with the substrate 100.

Figure 1F:
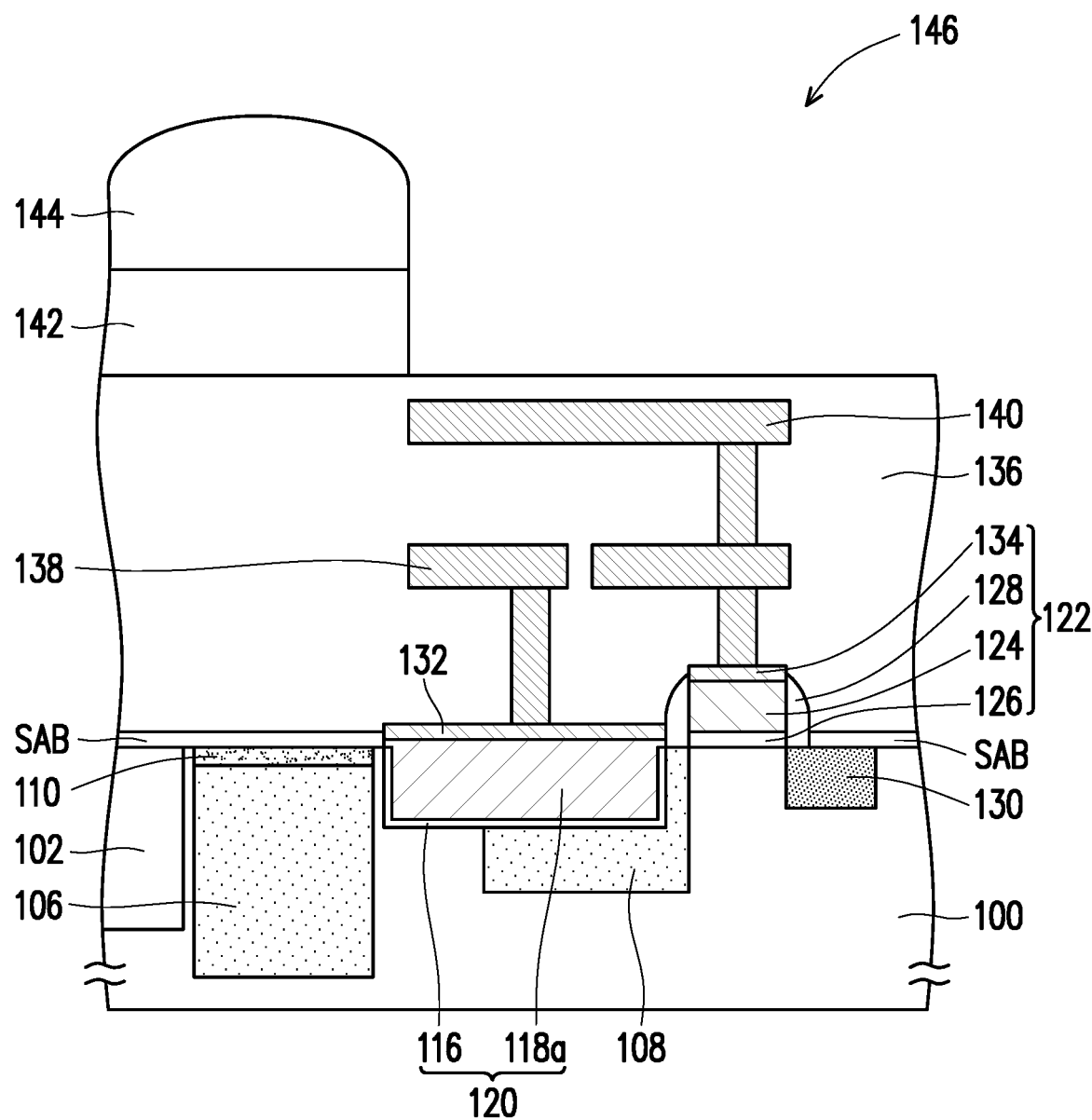

Please refer to FIG. 1F, a dielectric layer 136 covering the buried gate structure 120 and the gate structure 122 may be formed. The dielectric layer 136 may be a single layer structure or a multilayer structure. A material of the dielectric layer 136 is, for example, silicon oxide, silicon nitride or a combination thereof. A forming method of the dielectric layer 136 is, for example, chemical vapor deposition.

An interconnect structure 138 and an interconnect structure 140 may be formed in the dielectric layer 136. The interconnect structure 138 may be electrically connected to the buried gate 118a via the light shielding layer 132. The interconnect structure 140 may be electrically connected to the gate 128 via the metal silicide layer 134. The interconnect structure 138 and the interconnect structure 140 may respectively include a contact, a conductive line, or a combination thereof. A material of the interconnect structure 140 is, for example, copper, aluminum, or tungsten. A method of forming the interconnect structure 140 is, for example, the damascene process or a combination of the deposition process, the lithography process, and the etching process. In addition, the number of layers of the interconnect structure 138 and the number of layers of the interconnect structure 140 may be adjusted according to product requirements and may not be limited to the number of layers shown in the drawings.

A color filter layer 142 may be formed above the light sensing device 106. In the present embodiment, the color filter layer 142 may be formed on the dielectric layer 136. The color filter layer 142 is, for example, a red filter layer, a green filter layer, or a blue filter layer. A material of the color filter layer 142 is, for example, a photoresist material, and a forming method of the color filter layer 142 may be performed by spin coating, alignment, exposure, development, etc., which are well known to people skilled in the art and are not further illustrated herein.

A microlens 144 may be formed on the color filter layer 142. A material of the microlens 144 is, for example, a photoresist material. A forming method of the microlens 144 is, for example, spin-coating a microlens material layer (not shown) first, performing the lithography process on the microlens material layer by using a mask and applying high temperature to heat baking the microlens material layer into a circular arc lens shape, or the other forming method, such as spin coating, alignment, exposure, development, etching, etc., which are well known to people skilled in the art and are not further illustrated herein.

Hereinafter, an image sensor 146 of the present embodiment is illustrated by FIG. 1F. Moreover, although the forming method of the image sensor 146 is illustrated as an example of the aforementioned method, the invention is not limited thereto.

Please refer to FIG. 1F, the image sensor 146 includes the substrate 100, the light sensing device 106, the storage node 108, the buried gate structure 120, and the light shielding layer 132. The image sensor 146 may be a global shutter image sensor, but the invention is not limited thereto. The light sensing device 106 is disposed in the substrate 100. The storage node 108 is disposed in the substrate 100. The storage node 108 and the light sensing device 106 are separated from each other. A portion of the storage node 108 may be located in the substrate 100 at one side of the buried gate 118a away from the light sensing device 106 and may extend to the surface of the substrate 100. The buried gate structure 120 includes the buried gate 118a and the dielectric layer 116. The buried gate 118a is disposed in the substrate 100 and covers at least a portion of the storage node 108. A portion of the buried gate 118a may be located in the substrate 100 between the light sensing device 106 and the storage node 108. The dielectric layer 116 is disposed between the buried gate 118a and the substrate 100. The light shielding layer 132 is disposed on the buried gate 118a and located above the storage node 108. The light shielding layer 132 is electrically connected to the buried gate 118a.

The image sensor 146 may further include at least one of the pinning layer 110, the gate structure 122, the floating diffusion region 130, the dielectric layer 136, the interconnect structure 138, the interconnect structure 140, the color filter layer 142, and the microlens 144. The pinning layer 110 is disposed in the substrate 100 and located between the light sensing device 106 and the surface of the substrate 100. The gate structure 122 includes the gate 124 and the dielectric layer 126. The gate 124 is disposed on the substrate 100 and located at one side of the buried gate 118a away from the light sensing device 106. The gate 124 and the buried gate 118a are separated from each other. The dielectric layer 126 is disposed between the gate 124 and the substrate 100. The floating diffusion region 130 is disposed in the substrate 100 and located at one side of the gate structure 122 away from the buried gate structure 120. The dielectric layer 136 covers the buried gate structure 120 and the gate structure 122. The interconnect structure 138 and the interconnect structure 140 are located in the dielectric layer 136 and electrically connected to the buried gate 118a and the gate 124, respectively. The color filter layer 142 is disposed above the light sensing device 106. In the present embodiment, the color filter layer 142 may be disposed on the dielectric layer 136. The microlens 144 is disposed on the color filter layer 142.

In addition, the material, the arrangement, the conductive type, the forming method, and the effect of each component in the image sensor 146 have been illustrated in detail in the aforementioned embodiments, and the illustrations are not repeated here.

Based on the aforementioned embodiment, in the image sensor 146 and the manufacturing method thereof, the buried gate 118a is disposed in the substrate 100 and covers at least a portion of the storage node 108. The light shielding layer 132 is disposed on the buried gate 118a and located above the storage node 108. Therefore, the light shielding layer 132 blocks the stray light from illuminating the storage node 108 to effectively prevent stray light interference.

Figure 2:
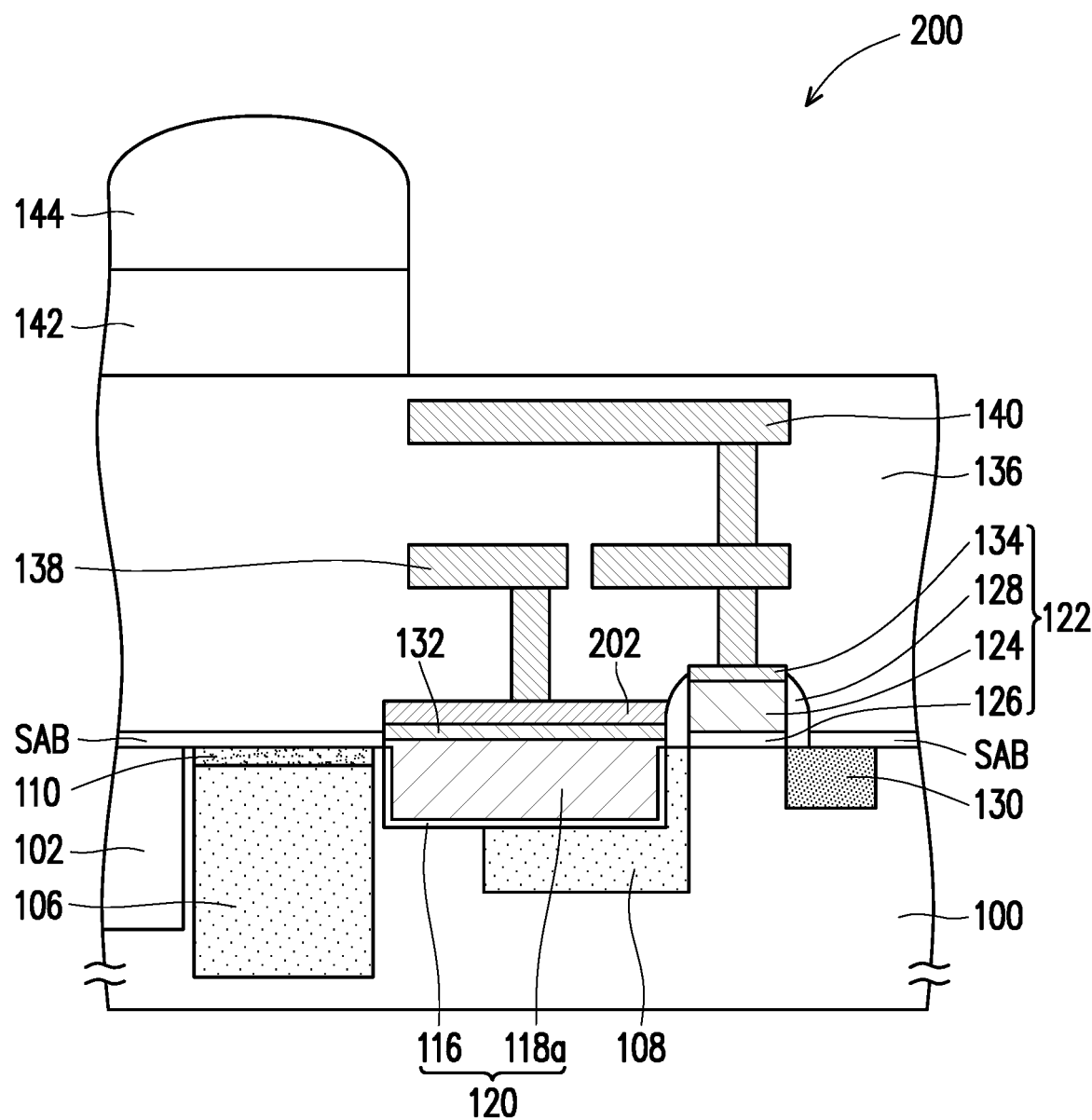
FIG. 2 is a cross-sectional view of an image sensor according to another embodiment of the invention.

FIG. 2 is a cross-sectional view of an image sensor according to another embodiment of the invention.

The differences between the manufacturing method of an image sensor 200 of FIG. 2 and the manufacturing method of the image sensor 146 of FIG. 1F are as below. Please refer to FIG. 2, after the step of FIG. 1E is performed, a light shielding layer 202 may be formed on the light shielding layer 132. A material of the light shielding layer 202 is, for example, a metal or a metal compound such as titanium (Ti), titanium nitride (TiN), tantalum (Ta), tantalum nitride (TaN), tungsten (W) or aluminum (Al). A forming method of the light shielding layer 202 is, for example, a combination of the deposition process, the lithography process, and the etching process. In addition, a method of subsequently completing the image sensor 200 may be referred to the illustrations of FIG. 1F, and the illustrations thereof are not repeated here.

Please refer to FIG. 1F and FIG. 2, compared to the image sensor 146, the image sensor 200 may further include the light shielding layer 202. The light shielding layer 202 is disposed on the light shielding layer 132. The interconnect structure 138 may be electrically connected to the buried gate 118a via the light shielding layer 132 and the light shielding layer 202. In addition, the arrangements, the materials, the forming methods, and the effects of other components in the image sensor 200 have been illustrated in detail in the aforementioned embodiments, and the illustrations thereof are not repeated here.

Based on the aforementioned embodiment, since the image sensor 200 further has the light shielding layer 202 apart from having the light shielding layer 132, the stray light may be more effectively blocked from illuminating the storage node 108 to further prevent stray light interference.

Figure 3A:
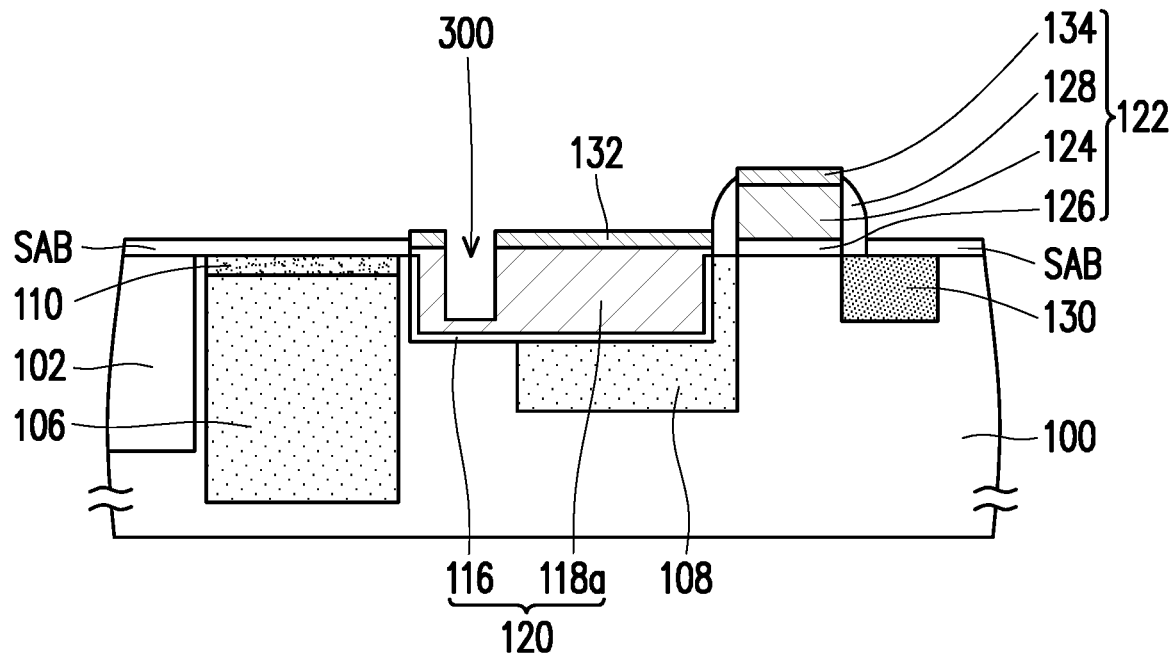
FIG. 3A to FIG. 3C are cross-sectional views of a manufacturing process of an image sensor according to an embodiment of the invention.
Figure 3B:
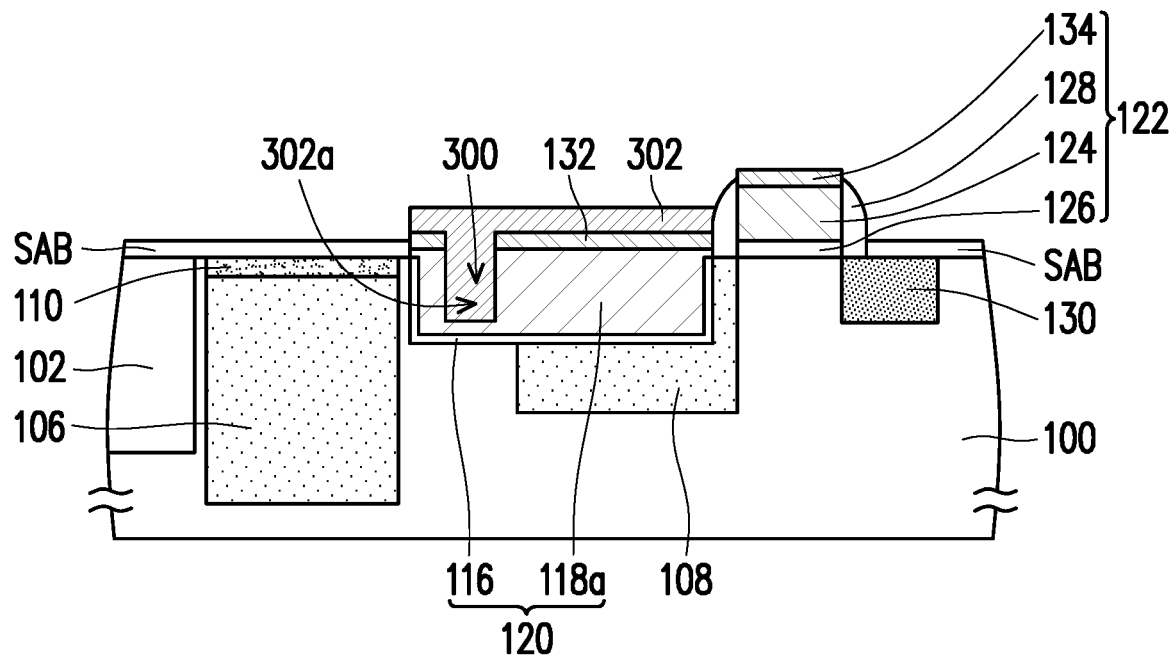
Figure 3C:
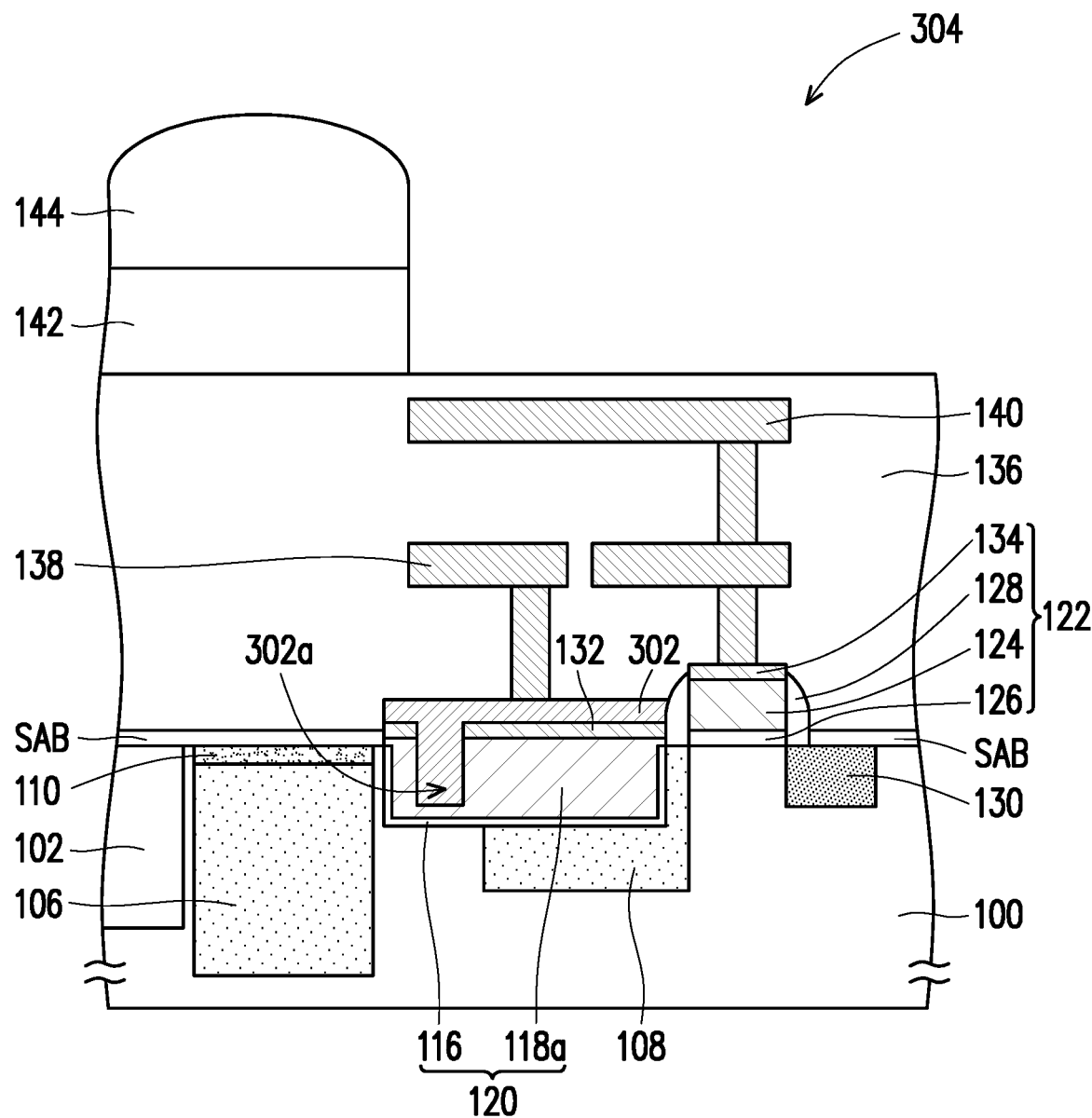

FIG. 3A to FIG. 3C are cross-sectional views of a manufacturing process of an image sensor according to an embodiment of the invention. FIG. 3A to FIG. 3C are cross-sectional views of the manufacturing process subsequent to the step of FIG. 1E.

Please refer to FIG. 3A, after the steps of FIG. 1E are performed, an opening 300 may be formed in the light shielding layer 132 and the buried gate 118a. The opening 300 may expose buried gate 118a. A forming method of the opening 300 is, for example, removing a portion of the light shielding layer 132 and a portion of the buried gate 118a by the lithography process and the etching process.

Please refer to FIG. 3B, a light shielding layer 302 filling in the opening 300 may be formed on the light shielding layer 132. As such, the light shielding layer 302 may be formed on the buried gate 118a. The light shielding layer 302 is located above the storage node 108 and electrically connected to the buried gate 118a. The light shielding layer 302 may have an extending portion 302a. The extending portion 302a extends into the buried gate 118a. The extending portion 302a may be located between the light sensing device 106 and the storage node 108. A forming method of the light shielding layer 302 is, for example, a combination of the deposition process, the lithography process, and the etching process. The material of the light shielding layer 302 is, for example, a metal or metal compound such as Ti, TiN, Ta, TaN, W or Al.

In the present embodiment, although the light shielding layer 302 is illustrated as an example of filling up the opening 300, the invention is not limited thereto. In another embodiment, under the condition that the thickness of the light shielding layer 302 is thinner, the light shielding layer 302 may not fill up the opening 300.

Please refer to FIG. 3C, the dielectric layer 136, the interconnect structure 138, the interconnect structure 140, the color filter layer 142, and the microlens 144 may be formed on the substrate 100. The manufacturing methods of the dielectric layer 136, the interconnect structure 138, the interconnect structure 140, the color filter layer 142 and the microlens 144 in an image sensor 304 of FIG. 3B may be referred to the illustrations of FIG. 1F, and the illustrations thereof are not repeated here.

Further, in the aforementioned manufacturing method of the image sensor 304, although the light shielding layer 132 may be formed between the light shielding layer 302 and the buried gate 118a, the invention is not limited thereto. In another embodiment, the light shielding layer 132 may not be formed in the manufacturing method of the image sensor 304.

Hereinafter, the image sensor 304 of the present embodiment is illustrated with reference to FIG. 3C. Further, although a forming method of the image sensor 304 is illustrated as an example of the aforementioned method, the invention is not limited thereto.

Please refer to FIG. 3C. The image sensor 304 includes a light shielding layer 302 and may further optionally include the light shielding layer 132. The light shielding layer 302 is disposed on the buried gate 118a and located above the storage node 108. The light shielding layer 302 is electrically connected to the buried gate 118a. The light shielding layer 302 has the extending portion 302a. The extending portion 302a extends into the buried gate 118a. The extending portion 302a may be located between the light sensing device 106 and the storage node 108. The light shielding layer 132 is disposed between the light shielding layer 302 and the buried gate 118a. In addition, the materials, the arrangements, the conductive types, the forming methods, and the effects of other components of the image sensor 304 in FIG. 3C have been illustrated in detail in the aforementioned embodiments, and the illustrations are not repeated here.

Based on the aforementioned embodiment, in the image sensor 304 and the manufacturing method thereof, the light shielding layer 302 may have the extending portion 302a. In this way, in addition to blocking the stray light by the portion of the light shielding layer 302 located above the top surface of the buried gate 118a, the stray light may be further blocked by the extending portion 302a of the light shielding layer 302. Therefore, the stray light interference may be further prevented.

Figure 4:
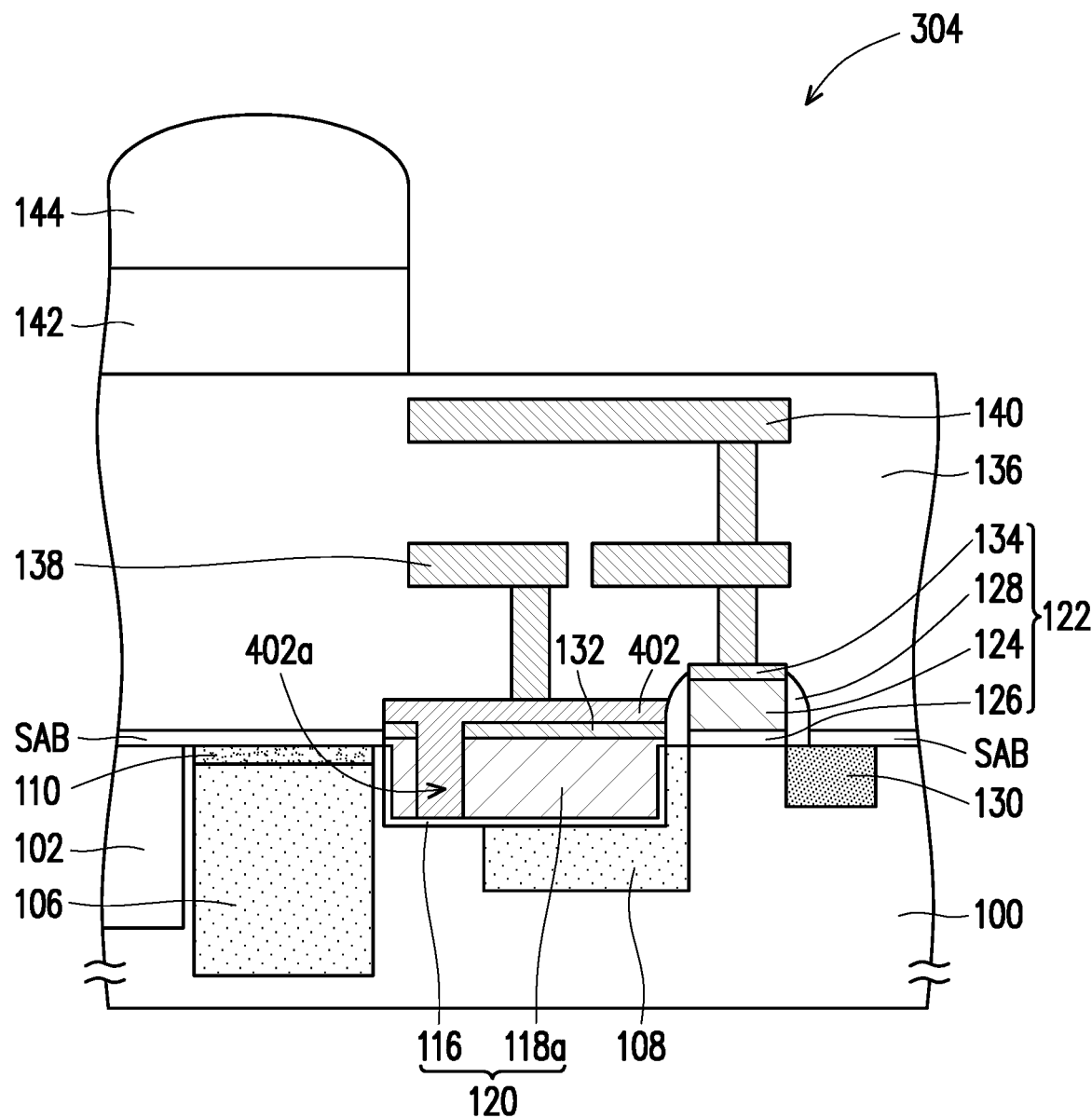
FIG. 4 is a cross-sectional view of an image sensor according to another embodiment of the invention.

FIG. 4 is a cross-sectional view of an image sensor according to another embodiment of the invention.

Please refer to FIG. 3C and FIG. 4, the differences between an image sensor 400 and the image sensor 304 are as follows. In the image sensor 400, the extending portion 402a of the light shielding layer 402 may be further extended to the dielectric layer 116. In addition, the arrangements, the materials, the forming methods, and the effects of other components of the image sensor 400 of FIG. 4 have been illustrated in detail in the aforementioned embodiments, and the illustrations are not repeated here.

Based on the aforementioned embodiment, in the image sensor 400, since the extending portion 402a of the light shielding layer 402 may be further extended to the dielectric layer 116, the stray light may be effectively blocked from illuminating the storage node 108 to further prevent the stray light interference.

Figure 5A:
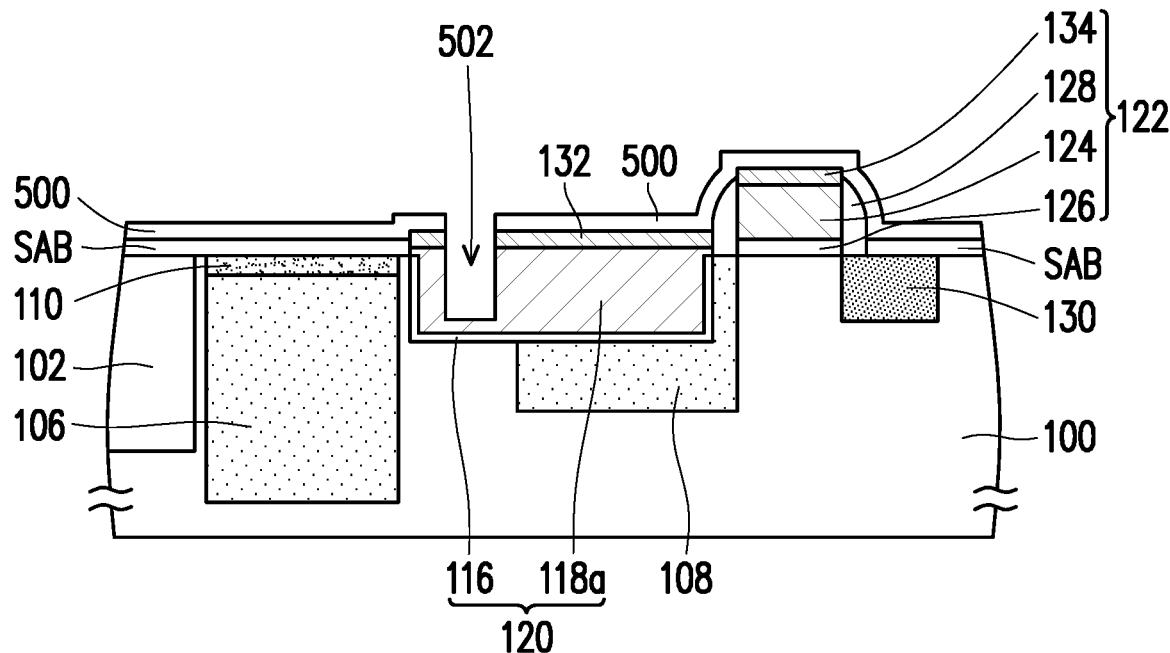
FIG. 5A to FIG. 5C are cross-sectional views of a manufacturing process of an image sensor according to another embodiment of the invention.
Figure 5B:
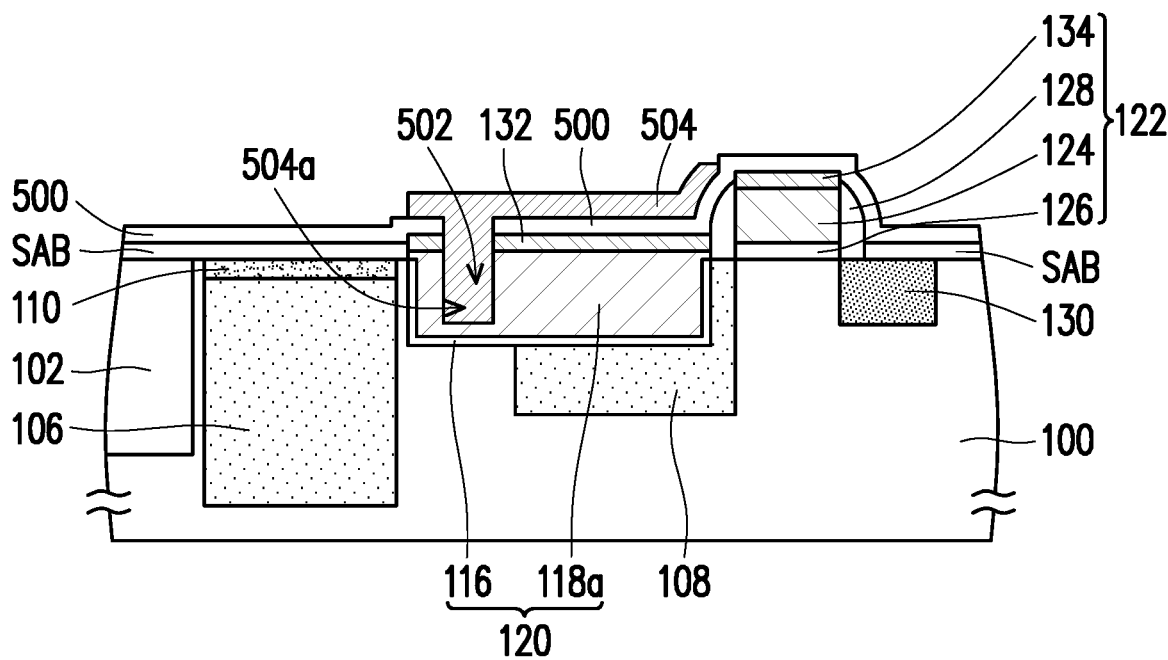
Figure 5C:
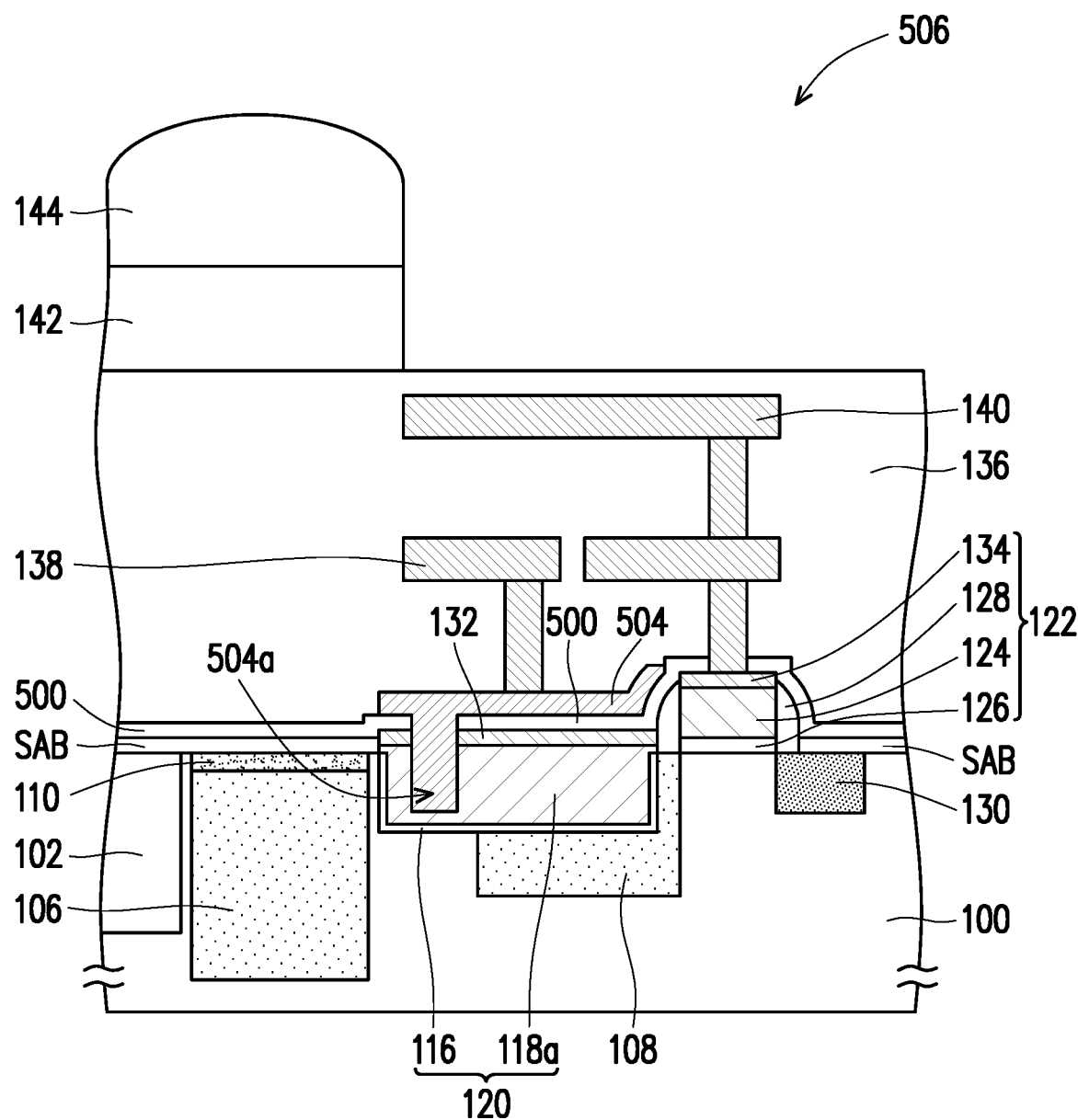

FIG. 5A to FIG. 5C are cross-sectional views of a manufacturing process of an image sensor according to another embodiment of the invention. FIG. 5A to FIG. 5C are cross-sectional views of the manufacturing process subsequent to the step of FIG. 1E.

Please refer to FIG. 5A, after the steps of FIG. 1E are performed, a dielectric layer 500 may be formed on the light shielding layer 132. In addition, the dielectric layer 500 may further cover the gate structure 122. A material of the dielectric layer 500 is, for example, silicon oxide. A forming method of the dielectric layer 500 is, for example, chemical vapor deposition.

An opening 502 may be formed in the dielectric layer 500, the light shielding layer 132, and the buried gate 118a. The opening 502 may expose the buried gate 118a. A forming method of the opening 502 is, for example, removing a portion of the dielectric layer 500, a portion of the light shielding layer 132, and a portion of the buried gate 118a by the lithography process and the etching process.

Please refer to FIG. 5B, a light shielding layer 504 filling in the opening 502 may be formed on the dielectric layer 500. As such, the light shielding layer 504 may be formed on the buried gate 118a. The light shielding layer 504 is located above the storage node 108 and electrically connected to the buried gate 118a. The light shielding layer 504 may have an extending portion 504a. The extending portion 504a passes through the dielectric layer 500 and extends into the buried gate 118a. The extending portion 504a may be located between the light sensing device 106 and the storage node 108. A forming method of the light shielding layer 504 is, for example, a combination of the deposition process, the lithography process, and the etching process. The material of the light shielding layer 504 is, for example, a metal or a metal compound such as Ti, TiN, Ta, TaN, W, or Al.

In the present embodiment, although the light shielding layer 504 is illustrated as an example of the filling up opening 502, the invention is not limited thereto. In another embodiment, under the condition that the thickness of the light shielding layer 504 is thinner, the light shielding layer 504 may not fill up the opening 502.

Please refer to FIG. 5C, the dielectric layer 136, the interconnect structure 138, the interconnect structure 140, the color filter layer 142, and the microlens 144 may be formed on the substrate 100. The interconnect structure 140 passes through the dielectric layer 500 and electrically connected to the gate 124. In addition, the manufacturing method of the dielectric layer 136, the interconnect structure 138, the interconnect structure 140, the color filter layer 142, and the microlens 144 in the image sensor 506 of FIG. 5C may be referred to the illustrations of FIG. 1F, and the illustrations thereof are not repeated here.

Moreover, in the aforementioned manufacturing method of the image sensor 506, although the light shielding layer 132 may be formed between the dielectric layer 500 and the buried gate 118a, the invention is not limited thereto. In another embodiment, the light shielding layer 132 may not be formed in the manufacturing method of the image sensor 506.

Hereinafter, the image sensor 506 of the present embodiment is illustrated with reference to FIG. 5C. In addition, although a forming method of the image sensor 506 is illustrated as an example of the aforementioned method, the invention is not limited thereto.

Please refer to FIG. 5C and FIG. 3C, the differences between the image sensor 506 and the image sensor 304 are as follows. The image sensor 506 may further include a dielectric layer 500. The dielectric layer 500 is disposed between the light shielding layer 504 and the buried gate 118a. For example, the dielectric layer 500 may be disposed between the light shielding layer 504 and the light shielding layer 132. The extending portion 504a passes through the dielectric layer 500 and extends into the buried gate 118a. In the present embodiment, although the bottom of the extending portion 504a stays in the buried gate 118a, the invention is not limited thereto. In another embodiment, the extending portion 504a may further extend to the dielectric layer 116. In addition, the materials, the arrangements, the conductive type, the forming methods, and the effects of other components of the image sensor 506 in FIG. 5C illustrated in detail in the aforementioned embodiments, and the illustrations are not repeated here.

Based on the aforementioned embodiment, in the image sensor 506 and the manufacturing method thereof, the light shielding layer 504 may have the extending portion 504a. In this way, in addition to blocking the stray light by the portion of the light shielding layer 504 located above the top surface of the buried gate 118a, the stray light may be further blocked by the extending portion 502a of the light shielding layer 504. Therefore, the stray light interference may be further prevented.

In each of the aforementioned embodiments, although the gate structure 122 is illustrated as an example of having the metal silicide layer 134, the invention is not limited thereto. In another embodiment, the gate structure 122 may not have metal silicide layer 134.

In addition, although the image sensor of the aforementioned embodiment is illustrated as an example with one or two layers of light shielding layer, the invention is not limited thereto. In some embodiments, the number of layers of the light shielding layer may also be three or more layers. That is, whether the number of layers of the light shielding layer is one or more layers is within the scope of the invention.

In summary, in the image sensor of the aforementioned embodiment and the manufacturing method thereof, since the buried gate is disposed in the substrate, the light shielding layer is disposed on the buried gate and located above the storage node. Therefore, the image sensor may use the light shielding layer to block the stray light from illuminating the storage node, thus the stray light interference can be effectively prevented.

Although the invention has been described with reference to the aforementioned embodiments, the invention is not limited to the aforementioned embodiments. It is apparent to one of ordinary skill in the art that modifications and variations to the described embodiments may be made without departing from the spirit and scope of the invention. Accordingly, the scope of the invention will be defined by the attached claims.

What is claimed is:

1. A manufacturing method of an image sensor, comprising:
    providing a substrate;
    forming a light sensing device in the substrate;
    forming a storage node in the substrate, wherein the storage node and the light sensing device are separated from each other;
    forming a buried gate structure in the substrate, wherein the buried gate structure comprises:
        a buried gate, disposed in the substrate and covering at least a portion of the storage node; and
        a first dielectric layer, disposed between the buried gate and the substrate; and
    forming a first light shielding layer on the buried gate, wherein the first light shielding layer is located above the storage node and electrically connected to the buried gate;
    the buried gate and the first light shielding layer are different materials,
    a portion of the buried gate is located directly above the storage node in a direction perpendicular to a top surface of the substrate, and
    a portion of the first light shielding layer is located directly above the storage node in the direction perpendicular to the top surface of the substrate.

2. The manufacturing method of the image sensor according to claim 1, further comprising forming a second light shielding layer on the first light shielding layer.

3. The manufacturing method of the image sensor according to claim 1, wherein the first light shielding layer has an extending portion, and the extending portion extends into the buried gate.

4. The manufacturing method of the image sensor according to claim 3, further comprising forming a third light shielding layer between the first light shielding layer and the buried gate.

5. The manufacturing method of the image sensor according to claim 3, further comprising forming a second dielectric layer between the first light shielding layer and the buried gate, wherein the extending portion passes through the second dielectric layer and extends into the buried gate.

6. The manufacturing method of the image sensor according to claim 1, further comprising forming a pinning layer in the substrate, wherein the pinning layer is located between the light sensing device and a surface of the substrate.

7. The manufacturing method of the image sensor according to claim 1, further comprising:
    forming a gate structure on the substrate, wherein the gate structure comprises:
        a gate, disposed on the substrate and located at one side of the buried gate away from the light sensing device, wherein the gate and the buried gate are separated from each other; and
        a third dielectric layer, disposed between the gate and the substrate; and
    forming a floating diffusion region in the substrate, wherein the floating diffusion region is located at one side of the gate structure away from the buried gate structure.

8. The manufacturing method of the image sensor according to claim 1, further comprising:
    forming a color filter layer above the light sensing device; and
    forming a microlens on the color filter layer.

* * * * *